Figure 1:
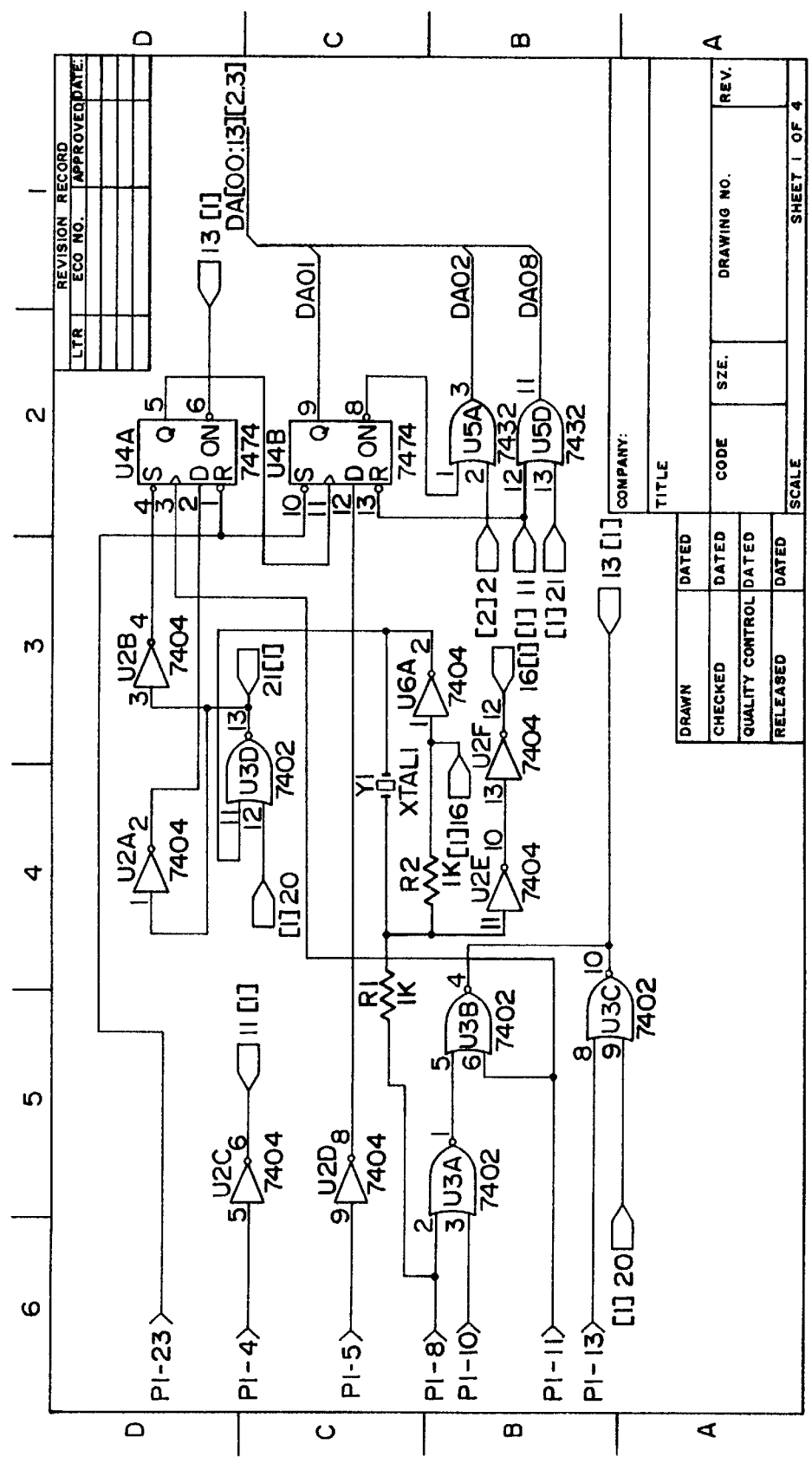

United States Patent [19]

Ott

[11] Patent Number: 6,081,657
[45] Date of Patent: Jun. 27, 2000

[54] METHOD OF LOCATING AND REPRESENTING CIRCUIT ELEMENTS OF AN ELECTRONIC CIRCUIT FOR THE FUNCTIONAL TESTING OF THE CIRCUIT

[75] Inventor: Rainer Ott, Munich, Germany

[73] Assignee: Test Plus Eletronic GmbH, Germany

[21] Appl. No.: 08/817,666

[22] PCT Filed: Oct. 20, 1995

[86] PCT No.: PCT/EP95/04120

§ 371 Date: Jun. 11, 1997

§ 102(e) Date: Jun. 11, 1997

[87] PCT Pub. No.: WO96/13010

PCT Pub. Date: May 2, 1996

[30] Foreign Application Priority Data

Oct. 21, 1994 [DE] Germany ............................. 44 37 744

[51] Int. Cl.[7] .................................................. G06F 17/50
[52] U.S. Cl. ............................. 395/500.12; 395/500.05; 395/500.04; 345/433; 345/964
[58] Field of Search ..................................... 364/488–491, 364/578; 345/433, 964; 395/500.02–500.19

[56] References Cited

U.S. PATENT DOCUMENTS

| | | | |
|---|---|---|---|
| 5,367,468 | 11/1994 | Fukasawa et al. | 364/490 |
| 5,416,721 | 5/1995 | Nishiyama et al. | 364/491 |
| 5,544,067 | 8/1996 | Rostoker et al. | 364/489 |
| 5,550,714 | 8/1996 | Nishiyama | 364/490 |
| 5,754,442 | 5/1998 | Minagawa et al. | 364/489 |
| 5,787,268 | 7/1998 | Sugiyama et al. | 395/500 |

OTHER PUBLICATIONS

Martin et al. ("A CAD Tool for Circuit Diagram Extraction from VLSI Layout Cells", IEEE Proceedings of the 32nd Midwest Symposium on Circuits and Systems, vol. 2, pp. 8–17–820, Aug. 14, 1989).

*Primary Examiner*—Kevin J. Teska
*Assistant Examiner*—Phallaka Kik
*Attorney, Agent, or Firm*—Scully, Scott, Murphy & Presser

[57] ABSTRACT

There is proposed a method for locating and representing circuit elements of an electronic circuit for functional testing of the circuit, the circuit diagram information of which circuit is stored as graphical output data for the production of a circuit diagram and as internal circuit diagram data of arbitrary format. From the stored graphical output data of the circuit there is represented on a screen a circuit diagram section and from the stored internal circuit diagram data there are determined the circuit diagram coordinates of arbitrary circuit elements, which are stored for use in locating selected circuit elements in a search data file. Further, for the represented circuit diagram section, the circuit diagram coordinates of the circuit elements stored in the search data file may be additionally marked on the screen. The circuit element is graphically selectable by means of coordinate position marked on the screen.

6 Claims, 5 Drawing Sheets

METHOD OF LOCATING AND REPRESENTING CIRCUIT ELEMENTS OF AN ELECTRONIC CIRCUIT FOR THE FUNCTIONAL TESTING OF THE CIRCUIT

DEFINITION OF TERMS +ps Internal circuit diagram data

CAD data file and possibly additional intermediate data file in an internal data format of the CAD system concerned.
Graphical circuit diagram data
Widely standardized, output data file for graphical representation of the circuit diagram, intended for the user.
Circuit elements
Arbitrary elements of the circuit: components, component terminals (pins), networks.
Circuit networks
The electrically conductive connections connecting the component terminals.
Component labels
Component designations contained in the graphical circuit diagram data, possibly as a text data file.
Circuit diagram coordinates
Circuit diagram page and X-Y-coordinates or raster field information of a circuit element on a circuit diagram.
Functional testing
Process steps in the functional testing of electronic component groups, concerned with preparation, carrying through and evaluation. The preparation includes also the provision of test programs and automatic test devices.

DESCRIPTION

The invention relates to a method of locating and representing circuit elements in an electronic circuit, for the functional testing of the circuit, the circuit diagram information of which circuit is stored as internal data of arbitrary format and as graphical data for the production of a circuit diagram.

In many areas of the production, functional testing and monitoring of electronic circuits a rapid access to the circuit diagram representation of an electronic component group of the circuit plays an important role. It is therefore usual to employ circuit diagrams drawn on paper. With extensive circuits, which are in particular spread over several pages, the search for the desired component or the desired component group can involve expenditure of much time and therefore be expensive. It is thus advantageous to represent such circuits, the circuit diagram information of which is available as graphical output data files for the production of the circuit diagram, on screen. The advantages of a screen representation of the circuit plan information of a circuit to be tested or repaired are, however, only fully manifest when it is ensured that it is easy to locate a particular component, network node or a component group.

In the state of the art this is, however, only possible when a search term is contained in the graphic data file as text information; that is, the description of a component is stored for example as a "label" command in text format in the graphics output data file.

One such manner of component selection on the basis of data in text format in the graphic output data file is described for example in the "Proceedings of the IEEE 1993", Custom Integrated Circuits Conference, May 9th 1993, 1321, 1323. Through selection of text data displayed on the screen the data associated with the selected component can be displayed. It is, however, increasingly unusual to store component designations in this way in the form of text data.

Further, in the above-mentioned citation there is described the screen representation of internal CAD data through selection of a hierarchical block displayed on the screen. Thereby, direct use is made of the internal CAD data, which is possible only with very great effort due to the variety of CAD internal data formats and the adaptation thereby made necessary.

Thus, it is the object of the invention to propose a method which makes possible location and subsequent representation of arbitrary circuit elements or component groups of a circuit, the circuit diagram information of which circuit is stored as graphical output data and as internal circuit diagram data of arbitrary format.

This object is achieved by means of the features set out in claim 1.

From the graphical output data there is represented on the screen a section of a circuit diagram. From the internal circuit diagram data, the circuit diagram coordinates of arbitrary circuit elements are determined and stored in a search data file. Through access to this search data file, selected circuit elements can be sought and represented on a screen. The designation is effected by means of selection of the correct circuit plan section and optionally by means of additional marking of the circuit element or its vicinity.

An advantage of the invention is found in that a rapid and simple location and representation of arbitrary elements of the circuit tested is possible. A further advantage lies in that from the internal circuit diagram data only individual coordinates are determined, and not the complete graphical image structure, so that a substantially simpler adaptation to various CAD internal data formats is made possible.

The coordinates of the circuit elements represented on the screen extract, contained in the search data file, can additionally be made visible, e.g. through the superimposition of small symbols on the screen, differing in colour. By graphical selection of the markings ("clicking on") the respective circuit elements can be selected or stored information relating thereto called up.

As circuit elements of the circuit there can be represented components, component terminals, component symbols, component designations, connection lines, connection points, test points and/or network nodes.

The position of a circuit element in the search data file can, for example, be determined from the starting point of a graphical symbol employed for circuit diagram representation.

It is further possible to represent stored additional information on selected components and/or network notes. Thereby, for example also the display of the test channel number of the test adapter associated with the network node is advantageous. For better recognition, selected circuit elements may be represented on the screen graphically emphasized, for example contrastingly coloured.

Figure 2:
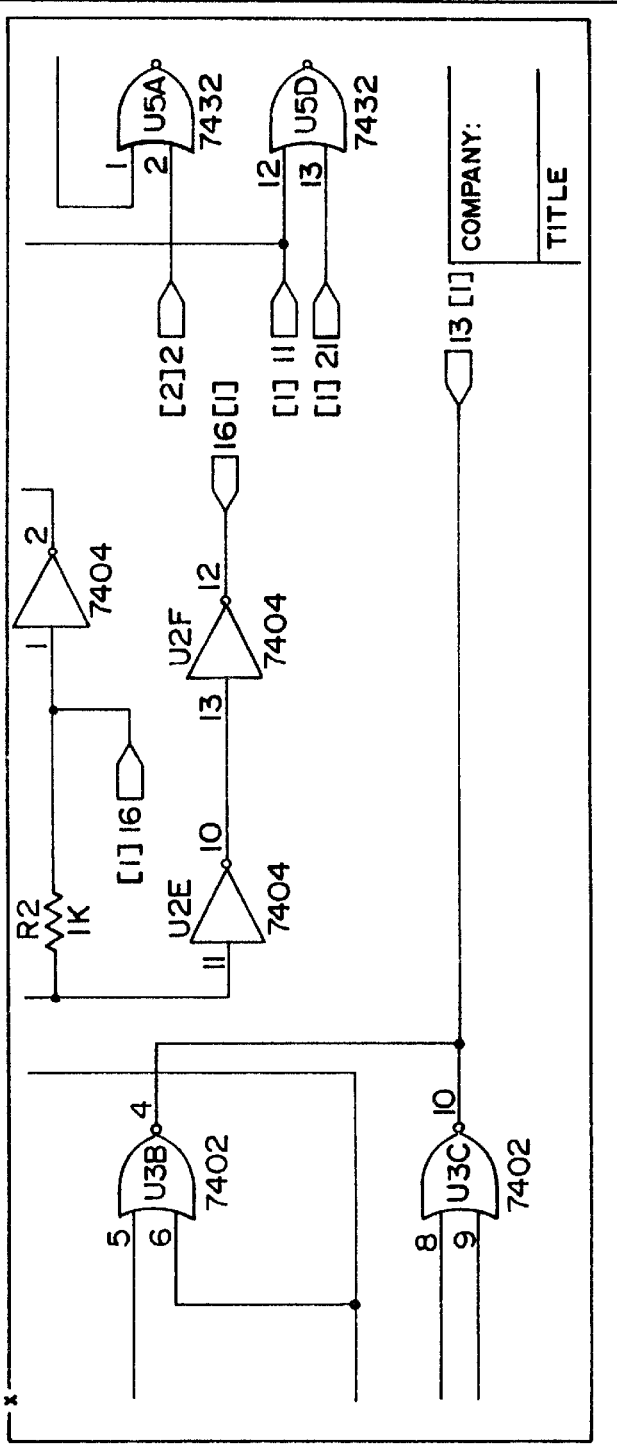

In the following there will be described an exemplary embodiment of the method in accordance with the invention, with reference to the Figures, in which FIG. 1 shows an extract from a circuit diagram of an electronic component group, FIG. 2 shows the screen representation of a section of the circuit diagram after selection of a component terminal, FIG. 3 the screen representation of FIG. 2 with marked circuit diagram coordinates of some circuit elements, FIG. 4 a screen representation with graphical emphasis of a network node, FIG. 5 a schematic representation of a method for determining a component terminal position.

As an example, FIG. 1 shows an extract from a circuit diagram of an electronic component group to be tested or to be repaired. After the selection of a component or a component terminal (as an example, terminal 4 of the component U3B) one obtains the screen representation shown in FIG. 2. Additionally, in a further box on the upper left, there are indicated all component terminals and associated component types of the network node (N37) which is connected with the selected component terminal, with the circuit diagram page concerned. By means of a ">" symbol the position of a test pin and the associated test channel number of the test adapter is emphasized.

Figure 3:
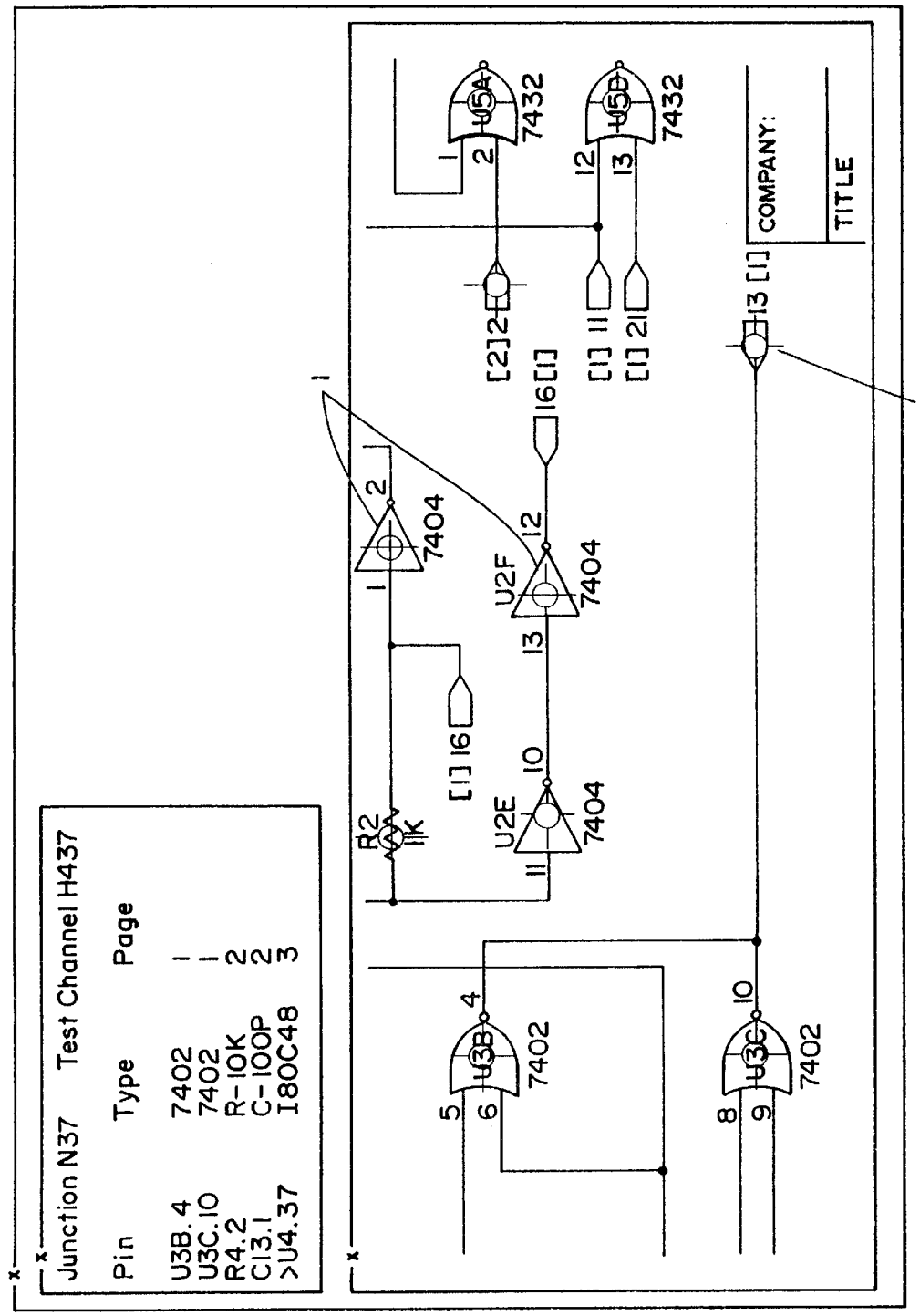

On the circuit plan section represented on the screen there may be superimposed, as is illustrated in FIG. 3, the markings 1 of the circuit diagram coordinates of the circuit elements contained in the search data file. By means of clicking on these markings 1 on the screen, one of the circuit elements can be selected and additional information such as component type or components connected to the network node can be represented in an additional screen window.

Figure 4:
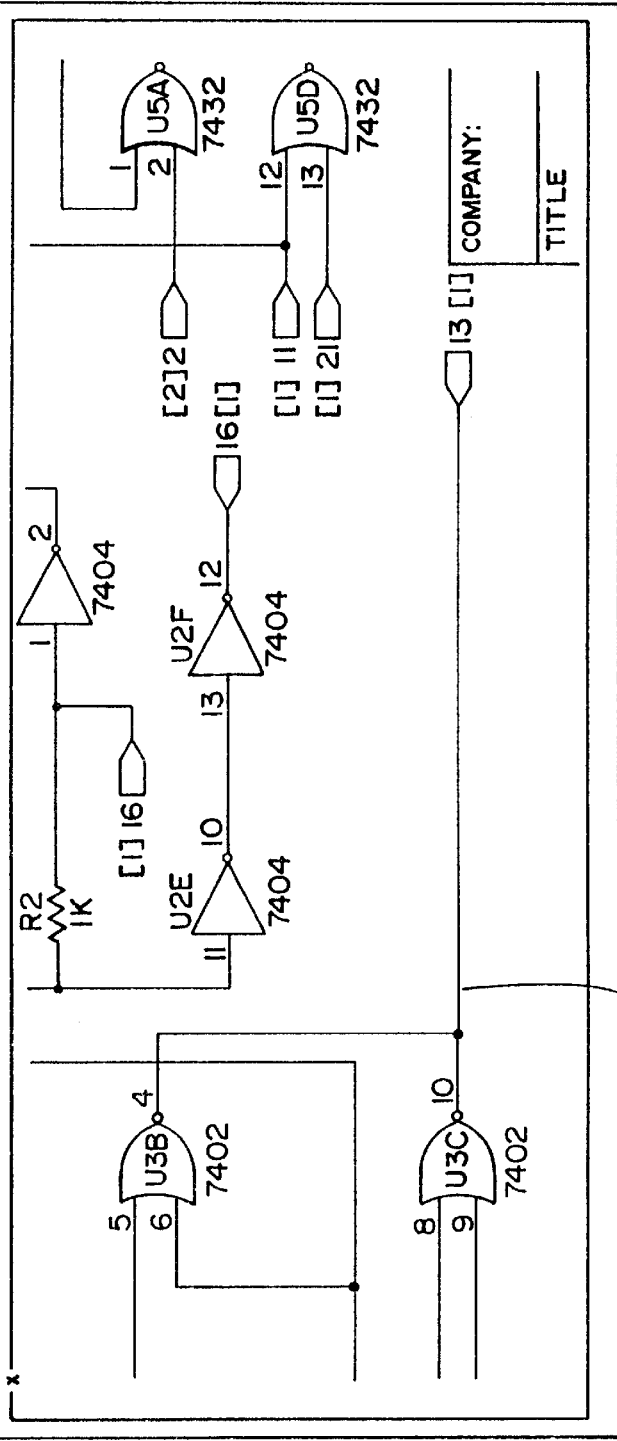
Figure 5:
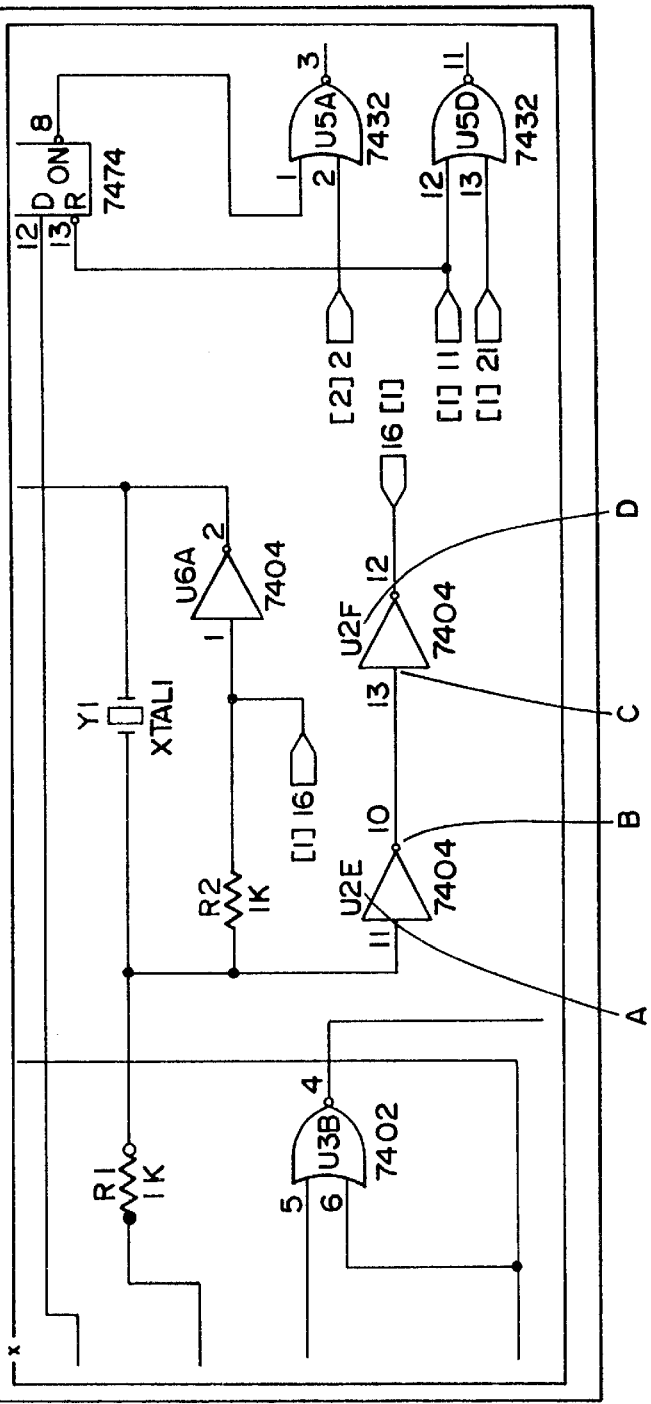

By means of selection of individual component terminals through "clicking on" on the screen, or via the keyboard, the associated circuit network 2 of the component terminal can be represented graphically emphasized, in particularly contrastingly coloured, as shown in FIG. 4. By means of differently coloured markings there can be made possible, for example, the association with different measurement channels. The connection network marked in such a clear manner can then be stored and output as a data file.

In evaluatable interim data files of the internal circuit plan data there is often contained only the absolutely necessary information for the circuit diagram construction. FIG. 5 illustrates a method with which there can be determined the exact position of the component terminals (U2E.10, U2F.13) of two components (U2E, U2F)—which are not contained in the intermediate data file—from the end points of the connection lines B, C contained in the internal circuit diagram data and the component designations likewise contained. From the data there can be determined that the two components (U2E, U2F) form a common network. Because of the slight spacing from the positions A and D of the component designations, the end B of the connection line can be identified as the position of the pin U2E.10 of the component U2E and the connection end C can be identified as position of the pin U2F.13 of the component U2F. Thus, the exact position of the component terminals U2E.10 and U2F.13, not contained in the internal CAD data, can be determined.

I claim:

1. A method for generating on a display screen a circuit diagram representation of a selected circuit element of an electronic circuit to be tested, comprising, retrieving circuit diagram information of the circuit which is stored as graphical output data for the production of a circuit diagram and as internal circuit diagram data of an arbitrary format (CAD data), wherein graphical output data comprises standardized output data for graphical representation of the circuit diagram, determining circuit diagram coordinates of the selected circuit element from stored internal circuit diagram data of the circuit and storing the determined circuit diagram coordinates in a search data file, displaying the selected circuit element in a circuit diagram representation of the circuit on the display screen by linking the coordinates stored in the search data file with graphical output data, and displaying a graphical symbol to indicate the position of the selected circuit element in the circuit diagram representation.

2. A method according to claim 1, further including selecting a circuit element by a graphical selection on the display screen.

3. A method according to claim 1 or 2, further including locating and displaying a selected circuit element from circuit elements including components, component terminals, component symbols, component designations, connection lines, connection points, test points or network nodes of the circuit.

4. A method according to claim 1 or 2, further including displaying on the display screen additional stored information about selected components and network nodes.

5. A method according to claim 1 or 2, further including graphically emphasizing selected circuit elements and coordinate positions on the display screen.

6. A method according to claim 5 wherein the selected circuit elements are graphically emphasized in contrasting color.

* * * * *